US007202805B2

(12) United States Patent
Sherry et al.

(10) Patent No.: US 7,202,805 B2
(45) Date of Patent: Apr. 10, 2007

(54) AMPLIFIER GAIN CALIBRATION SYSTEM AND METHOD

(75) Inventors: Adrian Sherry, Limerick (IE); Tomas Tansley, Co. Kerry (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/351,708

(22) Filed: Feb. 10, 2006

(65) Prior Publication Data

US 2006/0214827 A1 Sep. 28, 2006

Related U.S. Application Data

(60) Provisional application No. 60/652,034, filed on Feb. 11, 2005.

(51) Int. Cl.
*H03M 1/10* (2006.01)

(52) U.S. Cl. ...................................... 341/120; 341/139

(58) Field of Classification Search ............... 341/118, 341/120, 139
See application file for complete search history.

(56) References Cited

U.S. PATENT DOCUMENTS

| | | | | |
|---|---|---|---|---|
| 5,745,060 | A | 4/1998 | McCartney et al. | |
| 6,320,525 | B1 * | 11/2001 | Huang | 341/120 |
| 6,400,295 | B1 * | 6/2002 | Van Herzeele | 341/143 |
| 6,801,868 | B1 * | 10/2004 | Medelius et al. | 702/107 |
| 2003/0154045 | A1 * | 8/2003 | Sung et al. | 702/107 |

* cited by examiner

*Primary Examiner*—Howard L. Williams
(74) *Attorney, Agent, or Firm*—Iandiorio & Teska

(57) ABSTRACT

A gain calibration system for an amplifier includes an amplifier having inputs and outputs and an analog to digital converter having inputs and an output. There is a voltage supply for providing a plurality of output voltages. A first switching circuit couples at least one of the output voltages to the inputs of the amplifier in a first phase. A second switching circuit couples the outputs of the amplifier to the inputs of the analog to digital converter in the first phase and couples the sum of all of the at least one output voltages to the input of the analog to digital converter in a second phase. A processor responsive to the outputs of the analog to digital converter in the first and second phases calculates a calibration factor to accommodate for amplifier gain error.

35 Claims, 5 Drawing Sheets

PROCESSOR
$\frac{(av\ Vcal_1)G_a}{(av\ Vcal_1)N} = K$
$C_{ref} = \frac{G_a}{NK}$
REF+
ADC
REF-
Phase 2
OUT-
OUT+
IN+
IN-
VREF+
VREF-
R1
R2
R3
R4
VCAL1
76
72
74
73
75
26a
28a
111
14
10
26
28
42
44
24
38
40
12
16
18
34
36
30
32
20
22
131
82
78
88
90
92
94
96
98
100
102
104
80
84
86
20a
22a

AMPLIFIER GAIN CALIBRATION SYSTEM AND METHOD

RELATED APPLICATIONS

This application claims benefit of U.S. Provisional Application No. 60/652,034, filed Feb. 11, 2005, entitled "Calibration of the Gain of an Amplifier", incorporated herein by this reference.

FIELD OF THE INVENTION

This invention relates to an improved amplifier gain calibration system and method.

BACKGROUND OF THE INVENTION

A typical integrated circuit amplifier has a gain that is determined by the ratio of two or more resistance values. The exact value of these resistances and the ratio between them varies because of manufacturing tolerances: it is difficult to achieve a gain accuracy of better than approximately +/−0.1% of the nominal gain. In addition the ratio of the resistances can drift over temperature or time: the exact gain of the amplifier will change from its initial value.

A programmable gain instrumentation amplifier (PGIA) is a multi-stage amplifier with various gain settings that can be implemented by changing the resistances used to implement the gain, e.g., by switching in or out portions of the resistance. Because each gain setting uses different resistance ratios the gain on any particular gain setting can differ from another gain setting by approximately +/−0.1%.

If this amplifier is integrated as a system with an analog to digital converter (ADC), then the apparent transfer function of the converter plus the amplifier will not exactly equal the nominal gain of the PGIA, and will vary over temperature and over time. In addition, converting a constant input signal on different gain settings will produce different effective ADC results, because of the difference in gain error on the different gain settings.

The gain error of the ADC alone can be calibrated to a very high precision, e.g., <+/−0.0015%, by using techniques such as those described in U.S. Pat. No. 5,745,060. However the overall gain error of the system described above will, in general, be dominated by the inaccuracy in the gain of the amplifier. It is therefore desirable to be able to accurately calibrate the gain of an amplifier at any time.

One approach to calibrating the gain of an amplifier is to apply a known/measured voltage to the input of the amplifier, measure the output voltage and adjust the resistance values until the required gain is achieved. This has a number of disadvantages, the principal one being that the applied voltage must be measured accurately, which is not in general possible when the amplifier is installed in a circuit. A one-off calibration is possible, for example a factory calibration, however any subsequent drift in the amplifier gain is not compensated for; therefore the absolute accuracy will degrade over temperature and/or time. In addition, for a programmable gain amplifier, each gain setting must be individually calibrated because of the different resistance values at each gain.

Instead of adjusting the resistance values, the same technique as described above can be used employing a calibration constant stored in non-volatile memory and subsequently used by an ADC or a digital processor to digitally scale the ADC result to compensate for the amplifier gain error. However this also requires an accurately determined input signal, so is not suitable for calibration in the field and calibration values must be calculated and stored for each gain setting of a PGIA.

BRIEF SUMMARY OF THE INVENTION

It is therefore an object of this invention to provide an improved amplifier gain calibration system and method.

It is a further object of this invention to provide such an improved amplifier gain calibration system and method which accurately determines the gain of an amplifier in a circuit.

It is a further object of this invention to provide such an improved amplifier gain calibration system and method which accurately determines the gain of an amplifier in a circuit and corrects for gain errors.

It is a further object of this invention to provide such an improved amplifier gain calibration system and method which does not require expensive, precision resistances.

It is a further object of this invention to provide such an improved amplifier gain calibration system and method which can adjust the gain or adjust the output of the amplifier and/or system to accommodate for gain errors.

It is a further object of this invention to provide such an improved amplifier gain calibration system and method the accuracy of which is limited only by analog to digital converter and amplifier noise.

It is a further object of this invention to provide such an improved amplifier gain calibration system and method which reduces the influence of ADC noise during a calibration process.

It is a further object of this invention to provide such an improved amplifier gain calibration system and method which does not require precision input voltages.

The invention results from the realization that the gain of an amplifier in a circuit can be simply and elegantly calibrated by applying in a first phase one or more voltage(s) to the input of an amplifier to be calibrated whose output is connected to an analog to digital converter, applying in a second phase the sum of those voltages(s) to the input of the analog to digital converter, and calculating a calibration factor from the analog to digital converter outputs in the first and second phases to accommodate amplifier gain error.

The subject invention, however, in other embodiments, need not achieve all these objectives and the claims hereof should not be limited to structures or methods capable of achieving these objectives.

SUMMARY OF INVENTION: II

This invention features a gain calibration system for an amplifier including an amplifier having inputs and outputs and an analog to digital converter having inputs and an output. There is a voltage supply for providing a plurality of output voltages and a first switching circuit for coupling at least one of the output voltages to the inputs of the amplifier in a first phase. A second switching circuit couples the outputs of the amplifier to the inputs of the analog to digital converter in the first phase and couples the sum of all of the at least one output voltages to the inputs of the analog to digital converter in a second phase. A processor responsive to the outputs of the analog to digital converter in the first and second phases calculates a calibration factor to accommodate for amplifier gain error.

In a preferred embodiment, the second switching circuit may de-couple the outputs of the amplifier from the inputs of the analog to digital converter in the second phase. The voltage supply may include a voltage source and a voltage divider, including a plurality of impedances, the voltage divider coupled to the voltage source to provide the plurality of output voltages. The voltage source may be coupled as a reference voltage to the analog to digital converter. The impedances may include resistances. The first switching circuit in the first phase may couple the at least one output voltages selectively individually to the inputs of the amplifier to be calibrated. The second switching circuit in the second phase may couple the sum of all the at least one output voltages collectively to the inputs of the analog to digital converter. The processor may respond to the ratio of the outputs of the analog to digital converter in the first and second phases to calculate the calibration factor. The processor may respond to the ratio of the outputs of the analog to digital converter in the first and second phases to determine a phase factor such that the calibration factor is determined by the ideal gain of the amplifier divided by the product of the phase factor and the number of the at least one output voltages. The analog to digital converter in the first phase may average the amplifier outputs responsive to each of the at least one output voltages coupled to the amplifier. The processor in the first phase may average each of the outputs of the analog to digital converter produced in response to the amplifier outputs responsive to each of the at least one output voltages coupled to the amplifier. The amplifier may include a plurality of stages. The second switching circuit may couple the outputs of the amplifier to the inputs of the analog to digital converter when calibration is not being performed. A third switching circuit may couple the output of the first switching circuit to the inputs of the amplifier when calibration is being performed and may couple system inputs to the inputs of the amplifier when calibration is not being performed.

This invention also features a gain calibration system for an amplifier including an an amplifier having inputs and outputs and an analog to digital converter having inputs and an output. There is a voltage supply for providing a plurality of output voltages. A first switching circuit couples at least one of the output voltages to the inputs of the amplifier in a first phase. A second switching circuit couples the outputs of the amplifier to the inputs of the analog to digital converter in the first phase and couples the sum of all of the at least one output voltages to the inputs of the analog to digital converter in a second phase, wherein the analog to digital converter in the first phase averages the amplifier outputs responsive to each of the at least one output voltages coupled to the amplifier. A processor responsive to the outputs of the analog to digital converter in the first and second phases calculates a calibration factor to accommodate for amplifier gain error.

This invention further features a gain calibration system for an amplifier including an amplifier having inputs and outputs and an analog to digital converter having inputs and an output. There is a voltage supply for providing a plurality of output voltages. A first switching circuit couples at least one of the output voltages to the inputs of the amplifier in a first phase. A second switching circuit couples the outputs of the amplifier to the inputs of the analog to digital converter in the first phase and couples the sum of all of the at least one output voltages to the inputs of the analog to digital converter in a second phase. A processor responsive to the outputs of the analog to digital converter in the first and second phases calculates a calibration factor to accommodate for amplifier gain error, wherein the processor in the first phase averages each of the analog to digital converter outputs produced in response to the amplifier outputs responsive to each of the at least one output voltages coupled to the amplifier.

The invention further features a gain calibration system for an amplifier including an amplifier having inputs and outputs and an analog to digital converter having inputs and an output. There is a voltage supply for providing a plurality of output voltages. A first switching circuit couples at least one of the output voltages to the inputs of the amplifier in a first phase. A second switching circuit couples the sum of some of the at least one output voltages to the inputs of the analog to digital converter in a part of a second phase and couples the sum of the remainder of the at least one output voltages in at least one additional part of the second phase. A processor responsive to the outputs of the analog to digital converter in the first and second phases calculates a calibration factor to accommodate for amplifier gain error.

The invention also features a method of calibrating the gain of an amplifier with an analog to digital converter including by in a first phase applying at least one voltage to the input of an amplifier whose gain is to be calibrated and whose output is coupled to the input of an analog to digital converter and in a second phase applying the sum of all of the at least one voltages to the input of the analog to digital converter. A calibration factor is then calculated from the outputs of the analog to digital converter in the first and second phases to accommodate for amplifier gain error.

In a preferred embodiment, there may be N voltages selectively, individually applied in the first phase to the input of the amplifier to be calibrated. The sum of the N voltages may be applied in the second phase to the input of the analog to digital converter. The calibration factor may be calculated from the ratio of the analog to digital converter outputs in the first and second phases. A phase factor may be determined from the ratio of the outputs of the analog to digital converter in the first and second phases and the calibration factor may be calculated from the ideal gain $G_I$ of the amplifier divided by the product of the phase factor K and number N of the at least one voltages employed in the first and second phases. The N voltages applied to the analog to digital converter in the first phase may be averaged.

The invention further features a gain calibration system for an amplifier including an amplifier having inputs and outputs and an analog to digital converter having inputs, an output, and terminals for receiving a reference voltage. There is a voltage divider including a plurality of impedances coupled between the reference voltage. A first switching circuit couples the voltages across impedances selected from the plurality of impedances to the inputs of the amplifier in a first phase. A second switching circuit couples the outputs of the amplifier to the inputs of the analog to digital converter in the first phase and couples the voltage across all of the plurality of impedances to the inputs of the analog to digital converter in a second phase. A processor responsive to the outputs of the analog to digital converter in the first and second phases calculates a calibration factor to accommodate amplifier gain error.

In a preferred embodiment, the impedances may include resistances. The first switching circuit in the first phase may couple the voltages across the plurality of impedances selectively, individually to the inputs of the amplifier to be calibrated. The second switching circuit in the second phase may couple the voltage across all of the plurality of impedances collectively to the inputs of the analog to digital converter. The processor may respond to the ratio of the analog to digital converter outputs in the first and second phases to calculate the calibration factor. The processor may respond to the ratio of the analog to digital converter outputs in the first and second phases to determine a phase factor and to calculate the calibration factor from the ideal gain of the amplifier divided by the product of the phase factor and the number of impedances employed in the first and second phases. The analog to digital converter in the first phase may average amplified voltages, wherein the amplified voltages are produced from amplification of the voltages across the impedances selected from the plurality of impedances. The processor in the first phase may average the analog to digital converter outputs produced in response to amplified voltages, wherein the amplified voltages are produced from amplification of the voltages across the impedances selected from the plurality of impedances. The second switching circuit may de-couple the outputs of the amplifier to be calibrated from the input of the analog to digital converter in the second phase. The amplifier may include a plurality of stages. The second switching circuit may couple the outputs of the amplifier to the inputs of the analog to digital converter when calibration is not being performed. A third switching circuit may couple the output of the first switching circuit to the inputs of the amplifier when calibration is being performed and may couple system inputs to the inputs of the amplifier when calibration is not being performed.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
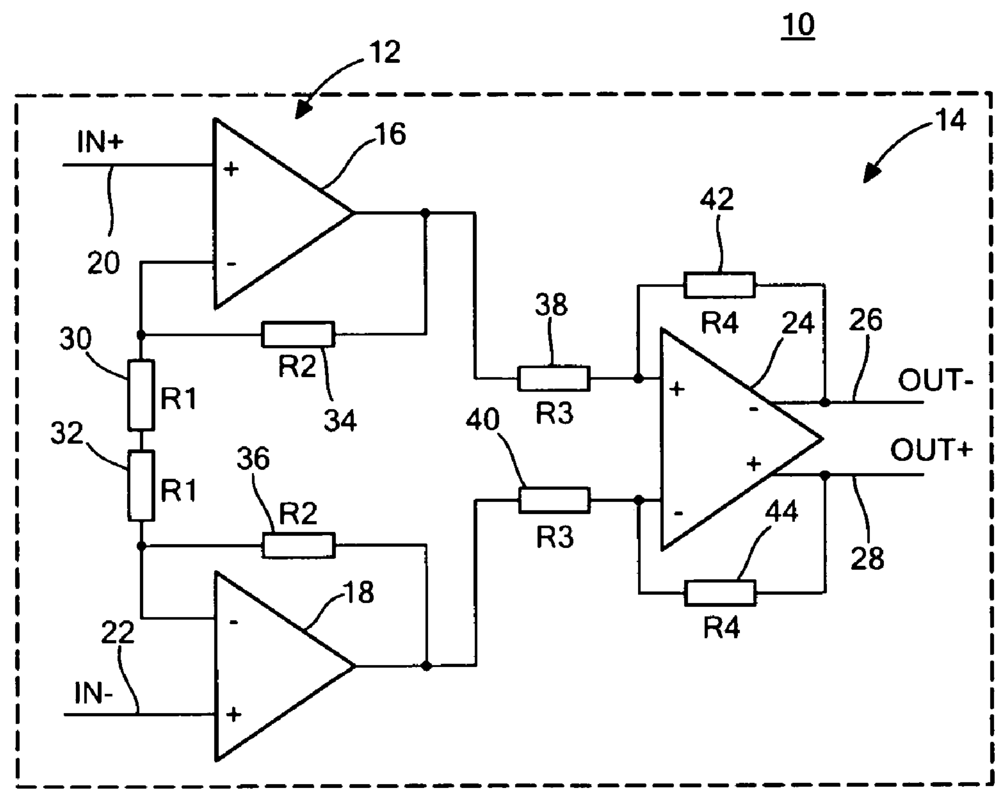
FIG. 1 is a schematic diagram of a prior art programmable gain instrumentation amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a typical prior art programmable gain instrumentation amplifier 10 including two stages 12 and 14. Differential amplifier stage 12 includes two amplifiers 16 and 18 which receive differential inputs 20, 22. Stage 14 includes amplifier 24 which provides differential outputs 26 and 28. Typically amplifier stage 12 also includes two resistances R1, 30, 32 and two resistances R2 34 and 36. Stage 14 includes two resistances R3 38 and 40 and two resistances R4 42 and 44. The gain of the amplifier may be one, less than one, or more than one. Typically it receives at its inputs 20, 22 a few milivolts and provides at its output a couple of volts. Its ideal gain $G_I$ can be calculated according to the equation:

$$G_I = \frac{R1 + R2}{R1} \times \frac{R4}{R3} \tag{1}$$

where R1, R2, R3 and R4 have ideal/nominal values.

For a programmable gain amplifier the ratios of R1/R2 and/or R3/R4 would be variable. Whether or not amplifier 10 is a programmable amplifier, its actual gain $G_A$ will generally not be equal to its ideal gain $G_I$, as the actual values for R1–R4 will not be ideal, as explained in the Background section, supra.

Figure 2:
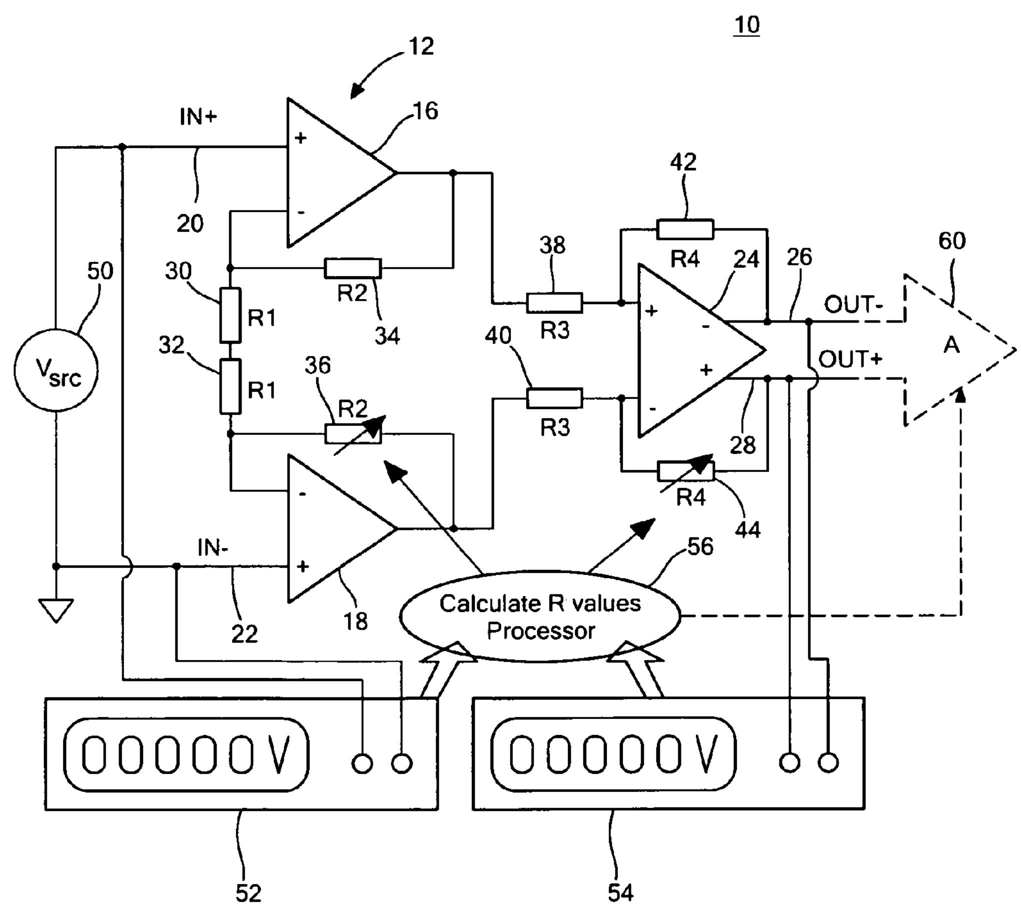
FIG. 2 is a schematic diagram of the prior art programmable gain instrumentation amplifier of FIG. 1 using a prior art “factory” or “bench” calibration scheme.

One simple way to correct the gain of amplifier 10 so that its actual gain $G_A$ is equal to the ideal gain $G_I$ is shown in FIG. 2. This scheme requires that the amplifier be disconnected from its circuit and have applied to it a precision voltage source 50, FIG. 2, and two precision multi meters 52 and 54, one connected to the input and one to the output and some sort of processor 56. Processor 56 senses the voltage in the precision voltage source at input 20 and 22 on multi meter 52 and the output voltage on outputs 26 and 28 through multi meter 54 and determines the actual gain $G_A$ of the system. Comparing this to the ideal gain $G_I$ processor 56 can then either adjust resistances such as R2, 36 and R4, 44 or it can provide an output to a subsequent circuit shown here simply as amplifier 60 which can be used to adjust the output without bringing the actual gain $G_A$ to be equal to the ideal gain $G_I$. The problem with this as pointed out in the Background, supra, is that it cannot be done when the amplifier is in a circuit, periodically, to guard against drift from temperature and time, for example, and, even more frequently, when the amplifier is a programmable one whose gain will be intentionally changed from time to time.

Figure 3:
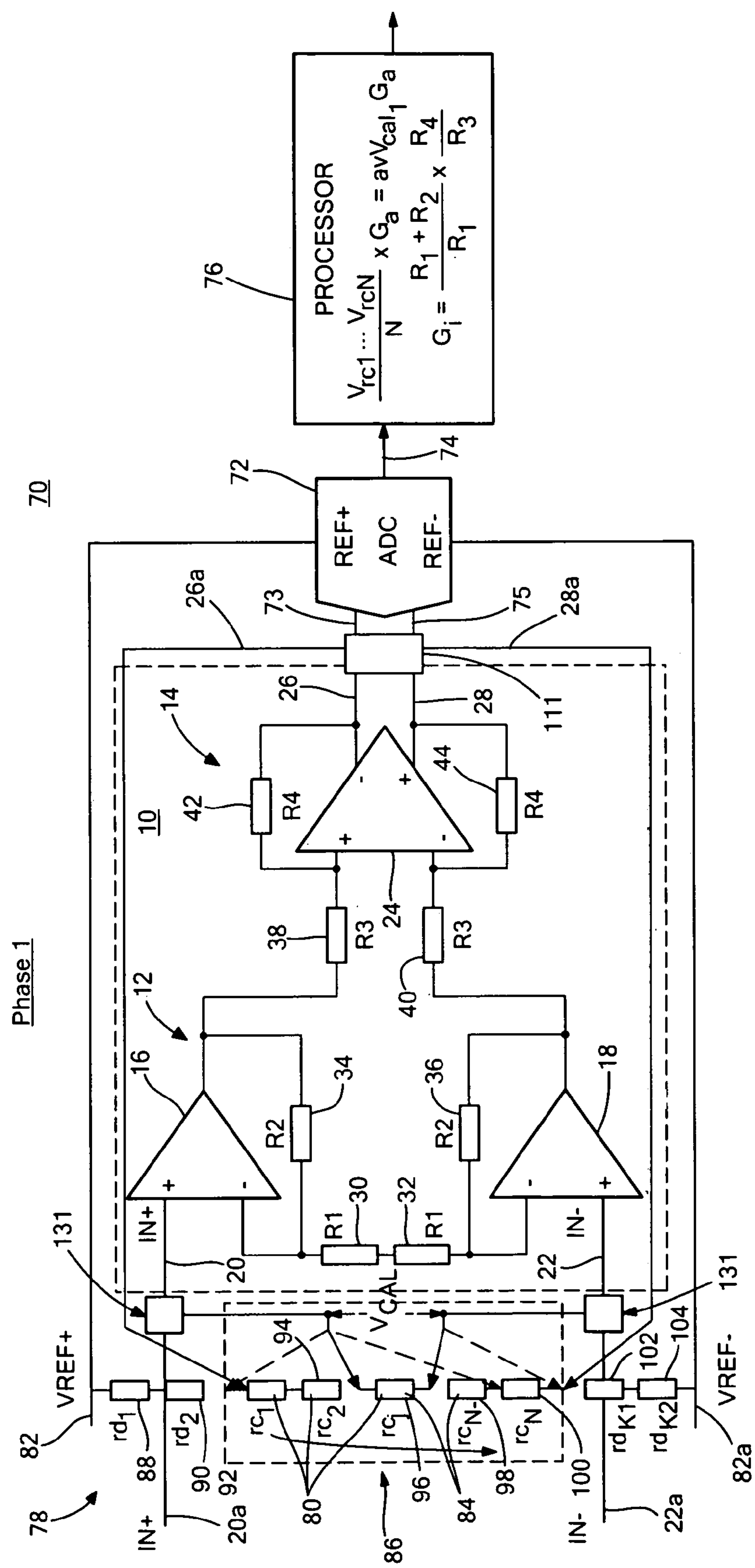
FIGS. 3 and 4 are schematic diagrams of a gain calibration system according to this invention in first and second phases, respectively.

In accordance with the gain calibration system 70, FIG. 3, of this invention includes amplifier 10 with stages 12 and 14 and analog to digital converter (ADC) 72 whose input is connected or coupled to the outputs 26, 28 of amplifier 10 by switching circuit 111 and whose output 74 is connected to processor 76. Gain calibration system 70 also includes a voltage supply 78 that generates a plurality of output voltages 80. Voltage supply 78 may include voltage sources, e.g., Vref 82 and Vref 82*a* that may be used to drive the reference inputs of ADC 72. The output voltages 80 are typically generated from impedances 84 structured as a voltage divider 86 implemented with resistances $rc_1$ 92, $rc_2$ 94, $rc_j$ 96, $rc_{N-1}$ 98, and $rc_N$ 100. Voltage divider 86 is typically coupled to voltage sources Vref 82 via resistances $rd_1$ 88, $rd_2$ 90, and coupled to Vref 82*a* via resistances $rd_{k1}$ 102 an $rd_{k2}$ 104. Resistances $rd_1$ 88, $rd_2$ 90, $rd_{k1}$ 102 and $rd_{k2}$ 104 are typically not part of voltage divider 86 and are used to ensure $V_{cal1}$ voltage is small enough so that it can be amplified by amplifier 10. Output voltages 80 are typically differential voltages, e.g., the voltage between two terminals of a resistance, such as the voltage between the two terminals of any of resistances 92–100. There are also included switching circuits shown schematically functionally at 110 and 131.

When the gain of amplifier 10 is to be calibrated in accordance with system 70, switching device 131 connects switching circuit 110 to inputs 20, 22 of amplifier 10. When system 70 needs to function as an amplifier, switching device 131 connects system inputs 20*a*, 22*a* to inputs 20, 22, respectively.

In operation, during a first phase, switching circuit 110 connects or couples the voltage from at least one of the impedances 92–100 to the inputs 20, 22 of amplifier 10 and switching circuit 111 connects or couples outputs 26 and 28 of amplifier 10 to ADC 72. In FIG. 3, switching circuit 110 selectively, individually applies the voltage across each of N resistors 92, 94, 96, 98 and 100 one at a time to the inputs 20, 22, where $r_{cj}$ is the resistor selected at a particular point in time. As thus, the applied input voltage at that particular point in time is provisionally referred to as $V_{cal1}$. That is, each output voltage, e.g., the voltage across one of resistances 92–100 is applied to inputs 20 and 22 to become the $V_{cal1}$ of the moment. This voltage is amplified by the actual gain $G_A$ of amplifier 10.

In one embodiment, the gained up signal at outputs 26 and 28 is delivered to ADC 72 that provides a number out in each case representing the selected voltage from $V_{rc1}$ through $V_{rcN}$. In this condition, ADC 72 produces N distinct conversion results, e.g., one result is produced for each of the N $V_{rcj}$ voltages. Processor 76 averages N separate conversion results to provide a single value that reflects the average output from amplifier 10 by applying voltages $V_{rc1}$ through $V_{rcN}$ to amplifier 10. Similarly, a multiple of N conversions could be performed and averaged by processor 76, provided each resistor of N resistors 92–100 is selected an equal number of times.

In another embodiment, the gained up signal at outputs 26 and 28 is delivered to ADC 72 that provides a number out representing the average of the gained up voltages from $V_{rc1}$ through $V_{rcN}$. This condition is used for an averaging ADC 72. That is, ADC 72 continuously samples the inputs at 26 and 28 over a predetermined amount of time, such that one single output is generated by ADC 72 on line 74. The single output on line 74 preferably reflects the average of applying N voltages $V_{rc1}$ through $V_{rcN}$ to amplifier 10. Similarly, more than N iterations of switching circuit 110 can be performed, provided that the number of switching steps is an integer multiple of N, e.g., if the N resistors are each selected twice, then 2N iterations can be performed while achieving the same average $V_{cal1}$ voltage.

Thus, at the end of the first phase, the value is obtained of the average $V_{cal1}$ times the actual gain $G_A$ as shown by:

$$\frac{V_{rc1} + V_{rc2} \ldots V_{rcN}}{N} x G_A = av.V_{cal1} \times G_A \tag{2}$$

Figure 4:
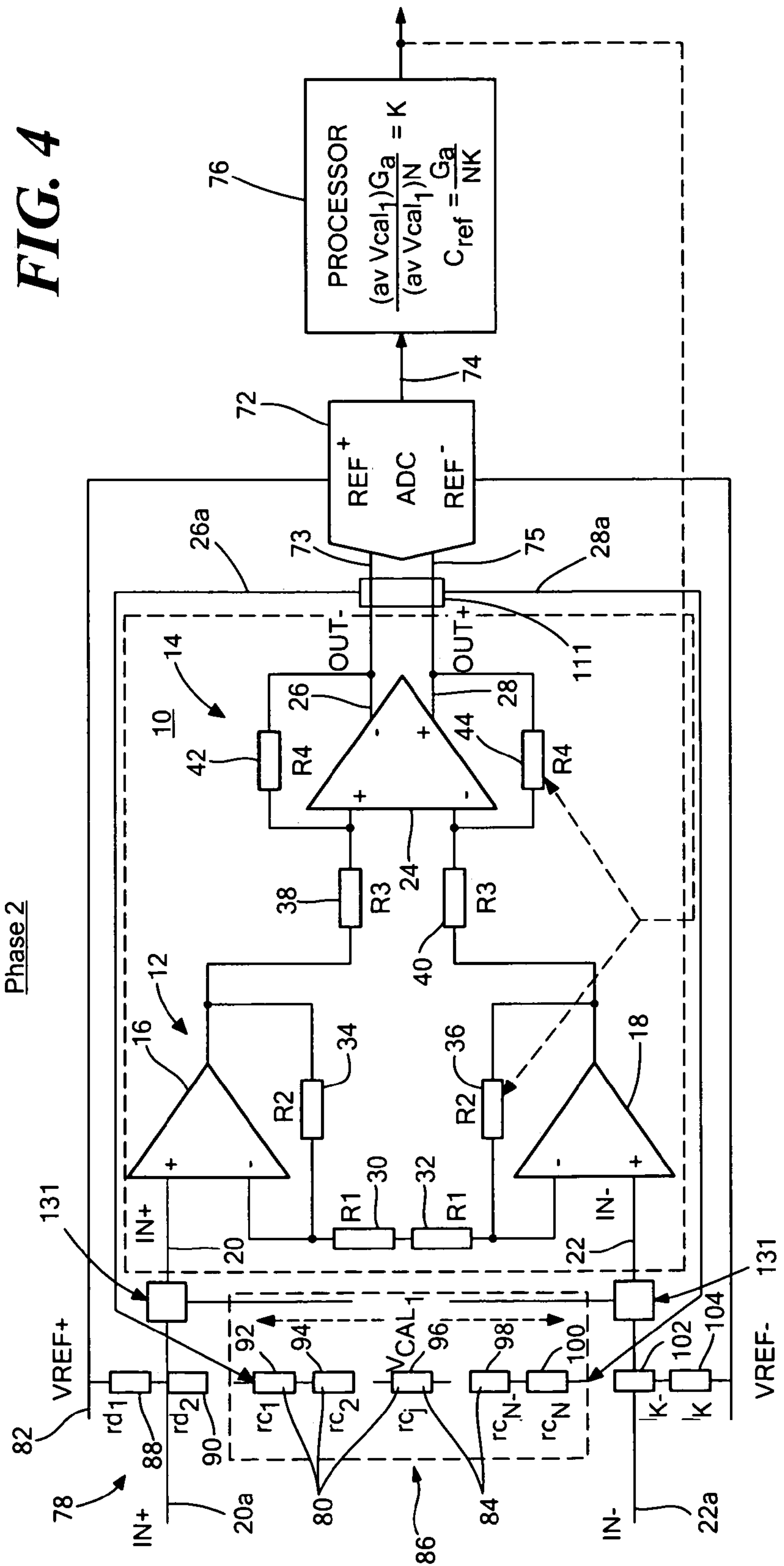

In a second phase, FIG. 4, the sum of the output voltages from N impedances $rc_1$, $rc_2$, $rc_j$, $rc_{N-1}$, $rc_N$, e.g., resistances 92–100 is connected to outputs 26*a* and 28*a*. Switching circuit 111 connects outputs 26*a* and 28*a* to ADC 72 and disconnects or de-couples outputs 26 and 28 of amplifier 10 from ADC 72. Now the output of ADC 72 represents, as can be understood, the average $V_{cal1}$ times N, because N times average $V_{cal1}$ is by definition equal to the sum of $V_{rc1}$ through $V_{rcN}$.

Thus, at the end of the second phase, the value is obtained of the average $V_{cal1}$ times N as shown by:

$$av.V_{cal1} \times N = \text{phase 2 output} \tag{3}$$

At this point processor 76 can also determine the ideal gain $G_I$ using equation (1) above.

The actual gain $G_A$ is not uniquely determined at this point but the ratio of the two outputs of the two phases of the ADC 72 defines the phase factor K:

$$\frac{av.V_{cal1} \times G_A}{av.V_{cal1} \times N} = K \tag{4}$$

av. $V_{cal1}$ in the numerator and denominator cancel out, meaning precise values of $V_{cal1}$ are not significant leaving:

$$\frac{G_A}{N} = K \tag{5}$$

A simple transposition shows that the actual gain $G_A$ is equal to NK, where N is known and K is known:

$$G_{A=NK} \tag{6}$$

Since the calibration factor, $C_{cal}$ is equal to the ratio of the ideal gain, $G_I$ and the actual gain $G_A$ as shown by:

$$C_{cal} = \frac{G_I}{G_A} \tag{7}$$

the calibration factor $C_{cal}$ can be obtained directly from the ratio of $G_I$ to the product NK:

$$C_{cal} = \frac{G_I}{NK} \tag{8}$$

thereby, obtaining the calibration factor for amplifier 10 using $G_A$ as defined in equation (6) above, and doing so while the amplifier is in a circuit. The calibration factor $C_{cal}$ can be used by processor 76 to simply adjust the output of ADC 72 to accommodate for the difference between the ideal gain and actual gain or it could be fed back to adjust resistances R2 36 and R4 44 as previously discussed. The result is the actual gain of system 70 equals the ideal gain of system 70.

In the second phase, because system 70 uses all N resistors as input to ADC 72, the input to ADC 72 is N times bigger than if a single resistor is used. Since the noise of ADC 72 is relatively independent of the input signal and a larger input signal is input to the ADC 72 with the same amount of noise, the result is an improved signal to noise ratio and a reduction in the effect of ADC noise during the calibration process.

While in this example five output voltages in the form of five impedances, resistances 92–100 of the voltage divider 86, have been used, this is not a necessary limitation of the invention as more or less output voltages may be used. If only one output voltage is used, for example, voltage across $rc_j$, resistance 96, then the averaging explained with respect to processor 76 would be unnecessary since N would be equal to one.

The first phase and second phase as described above do not imply that the first phase necessarily precedes the second phase in time. Those skilled in the art will understand that the operations of the first and second phases discussed above may be preformed in any order and at any desired point in time. The individual phases may also be split in time, or split in parts with intermediate results stored, for example, in processor 76. Although as described above, the voltage across all N resistors is applied collectively as input to ADC 72 in the second phase, this is not a necessary limitation of this invention, as in other examples, the voltage across a part of the N resistors, e.g., N/2 resistors, may be applied in a first part of the second phase and the voltage across the remaining resistors, e.g., N/2 resistors may be applied in additional parts of the second phase.

Figure 5:
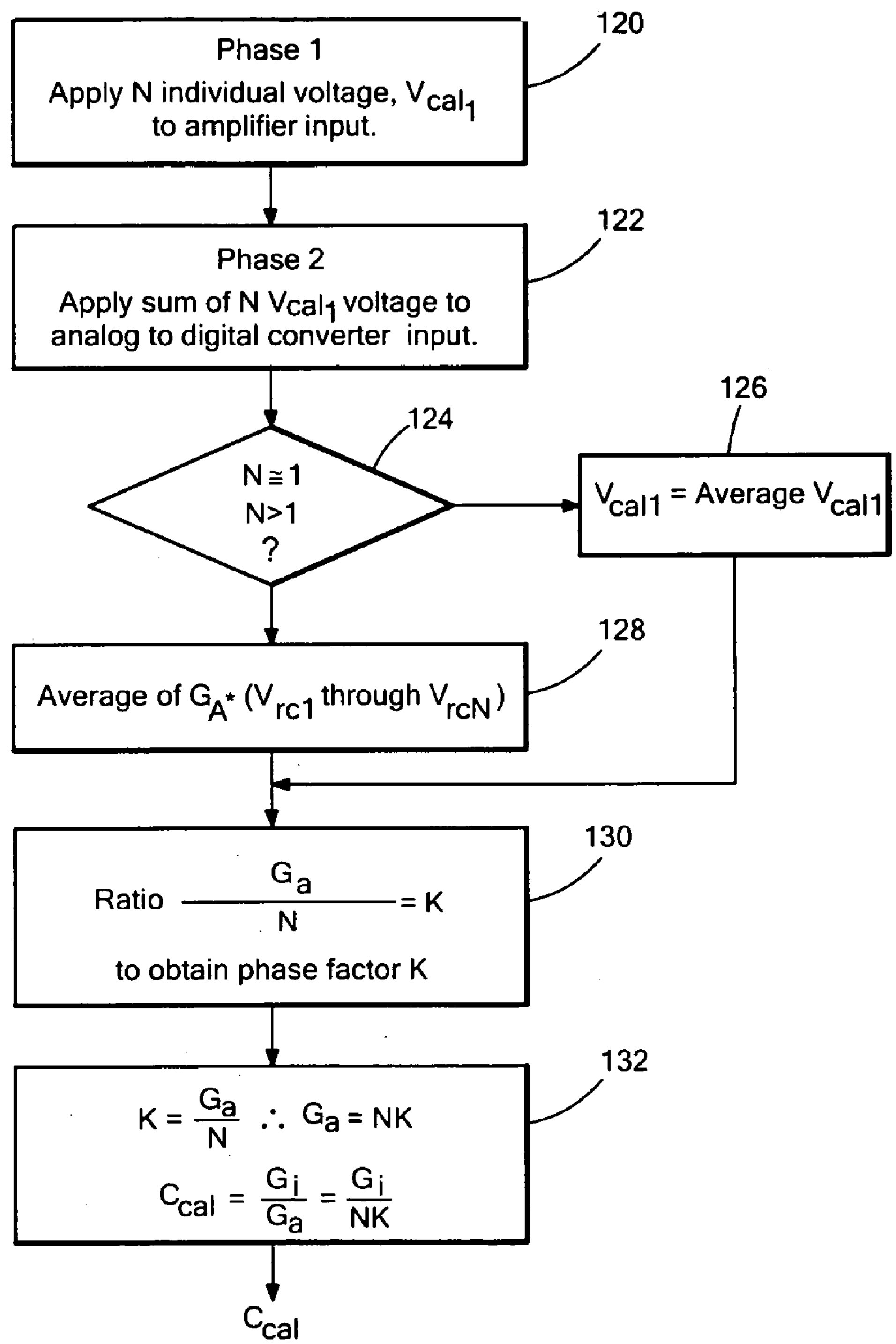
FIG. 5 is a diagram of a method according to this invention.

The method according to this invention, FIG. 5, involves in phase 1 applying N individual voltages $V_{cal1}$ to the amplifier input in step 120. In phase 2, step 122, there is directly applied the sum of the N $V_{cal1}$ voltages to the analog to digital computer. If N is determined to be equal to one in step 124, then $V_{cal1}$ is equal to the average of $V_{cal1}$ as shown at 126. If N is greater than one in step 124, then the average of $G_A$ times ($V_{rc1}$ through $V_{rCN}$) voltage is taken in step 128. The ratio of the average $V_{cal1}$ multiplied by the actual gain $G_A$ to the average $V_{cal1}$ multiplied by the number of voltage sources, N, applied is calculated to obtain the phase factor K step 130. The av. $V_{cal1}$ in the numerator and denominator cancel out leaving $G_A/N=K$. Then in step 132, transposing, it can be seen that the actual gain $G_A$ is equal to NK and since calibration factor $C_{cal}$ is equal to the ratio of the ideal gain $G_1$ to the actual gain $G_A$, it can be seen that the calibration factor $C_{cal}$ can be obtained from the ratio of the known value of $G_1$ to the product of the known values N and K in step 132. Thus with the calibration factor $C_{cal}$ ascertained, amplifier 10, ADC 72, or processor 76 can be adjusted as needed and while amplifier 10 is connected in a circuit.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A gain calibration system for an amplifier comprising:
- an amplifier having inputs and outputs;
- an analog to digital converter having inputs and an output;
- a voltage supply for providing a plurality of output voltages;
- a first switching circuit for coupling at least one of said output voltages to the inputs of the amplifier in a first phase;
- a second switching circuit for coupling the outputs of the amplifier to the inputs of the analog to digital converter in the first phase and coupling the sum of all of the at least one output voltages to the inputs of the analog to digital converter in a second phase; and
- a processor responsive to the outputs of said analog to digital converter in said first and second phases to calculate a calibration factor to accommodate for amplifier gain error.

2. The gain calibration system of claim 1 in which said second switching circuit de-couples the outputs of the amplifier from the inputs of the analog to digital converter in the second phase.

3. The gain calibration system of claim 1 in which said voltage supply includes a voltage source and a voltage divider, including a plurality of impedances, said voltage divider coupled to the voltage source to provide said plurality of output voltages.

4. The gain calibration system of claim 3 in which said voltage source is coupled as a reference voltage to said analog to digital converter.

5. The gain calibration system of claim 3 in which said impedances include resistances.

6. The gain calibration system of claim 1 in which said first switching circuit in the first phase couples the at least one output voltages selectively, individually to the inputs of the amplifier to be calibrated.

7. The gain calibration system of claim 1 in which said second switching circuit in the second phase couples the sum of all the at least one output voltages collectively to the inputs of the analog to digital converter.

8. The gain calibration system of claim 1 in which said processor responds to the ratio of the outputs of said analog to digital converter in the first and second phases to calculate the calibration factor.

9. The gain calibration system of claim 8 in which said processor responds to the ratio of the outputs of said analog to digital converter in the first and second phases to determine a phase factor such that said calibration factor is determined by the ideal gain of said amplifier divided by the product of said phase factor and the number of the at least one output voltages.

10. The gain calibration system of claim 1 in which the analog to digital converter in the first phase averages the amplifier outputs responsive to each of the at least one output voltages coupled to the amplifier.

11. The gain calibration system of claim 1 in which the processor in the first phase averages each of the outputs of said analog to digital converter produced in response to the amplifier outputs responsive to each of the at least one output voltages coupled to the amplifier.

12. The gain calibration system of claim 1 in which said amplifier includes a plurality of stages.

13. The gain calibration system of claim 1 in which the second switching circuit couples the outputs of said amplifier to the inputs of said analog to digital converter when calibration is not being performed.

14. The gain calibration system of claim 1 further including a third switching circuit for coupling the output of said first switching circuit to said inputs of said amplifier when calibration is being performed and coupling system inputs to said inputs of said amplifier when calibration is not being performed.

15. A gain calibration system for an amplifier comprising:
- an amplifier having inputs and outputs;
- an analog to digital converter having inputs and an output;
- a voltage supply for providing a plurality of output voltages;
- a first switching circuit for coupling at least one of said output voltages to the inputs of the amplifier in a first phase;

a second switching circuit for coupling the outputs of the amplifier to the inputs of the analog to digital converter in the first phase and coupling the sum of all of the at least one output voltages to the inputs of the analog to digital converter in a second phase, wherein said analog to digital converter in the first phase averages the amplifier outputs responsive to each of the at least one output voltages coupled to the amplifier; and a processor responsive to the outputs of said analog to digital converter in said first and second phases to calculate a calibration factor to accommodate for amplifier gain error.

16. A gain calibration system for an amplifier comprising:

an amplifier having inputs and outputs;

an analog to digital converter having inputs and an output;

a voltage supply for providing a plurality of output voltages;

a first switching circuit for coupling at least one of said output voltages to the inputs of the amplifier in a first phase;

a second switching circuit for coupling the outputs of the amplifier to the inputs of the analog to digital converter in the first phase and coupling the sum of all of the at least one output voltages to the inputs of the analog to digital converter in a second phase; and a processor responsive to the outputs of said analog to digital converter in said first and second phases to calculate a calibration factor to accommodate for amplifier gain error, wherein the processor in the first phase averages each of the analog to digital converter outputs produced in response to the amplifier outputs responsive to each of the at least one output voltages coupled to the amplifier.

17. A gain calibration system for an amplifier comprising:

an amplifier having inputs and outputs;

an analog to digital converter having inputs and an output;

a voltage supply for providing a plurality of output voltages;

a first switching circuit for coupling at least one of said output voltages to the inputs of the amplifier in a first phase;

a second switching circuit for coupling the sum of some of the at least one output voltages to the inputs of the analog to digital converter in a part of a second phase and coupling the sum of the remainder of the at least one output voltages in at least one additional part of said second phase; and a processor responsive to the outputs of said analog to digital converter in said first and second phases to calculate a calibration factor to accommodate for amplifier gain error.

18. A method of calibrating the gain of an amplifier with an analog to digital converter comprising:

in a first phase applying at least one voltage to the input of an amplifier whose gain is to be calibrated and whose output is coupled to the input of an analog to digital converter, in a second phase applying the sum of all of the at least one voltages to the input of the analog to digital converter; and calculating a calibration factor from the outputs of said analog to digital converter m said first and second phases to accommodate for amplifier gain error.

19. The method of calibrating the gain of an amplifier of claim 18 in which there are N voltages selectively, individually applied in the first phase to the input of the amplifier to be calibrated.

20. The method of calibrating the gain of an amplifier of claim 19 in which the sum of the N voltages is applied in the second phase to the input of the analog to digital converter.

21. The method of calibrating the gain of an amplifier of claim 19 further including averaging the N voltages applied to the analog to digital converter in the first phase.

22. The method of calibrating the gain of an amplifier of claim 18 in which the calibration factor is calculated from the ratio of the analog to digital converter outputs in the first and second phases.

23. The method of calibrating the gain of an amplifier of claim 22 further including determining, from the ratio of the outputs of the analog to digital converter in the first and second phases, a phase factor K and calculating the calibration factor from the ideal gain $G_I$ of the amplifier divided by the product of the phase factor K and number N of the at least one voltages employed in the first and second phases.

24. A gain calibration system for an amplifier comprising:

an amplifier having inputs and outputs;

an analog to digital converter having inputs, an output, and terminals for receiving a reference voltage;

a voltage divider including a plurality of impedances coupled between said reference voltage;

a first switching circuit for coupling the voltages across impedances selected from said plurality of impedances to the inputs of the amplifier in a first phase;

a second switching circuit for coupling the outputs of the amplifier to the inputs of the analog to digital converter in the first phase and coupling the voltage across all of the plurality of impedances to the inputs of said analog to digital converter in a second phase; and a processor responsive to the outputs of said analog to digital converter in said first and second phases to calculate a calibration factor to accommodate amplifier gain error.

25. The gain calibration system of claim 24 in which said impedances include resistances.

26. The gain calibration system of claim 24 in which said first switching circuit in the first phase couples the voltages across the plurality of impedances selectively, individually to the inputs of the amplifier to be calibrated.

27. The gain calibration system of claim 26 in which the analog to digital converter in the first phase averages amplified voltages, wherein said amplified voltages are produced from amplification of the voltages across the impedances selected from the plurality of impedances.

28. The gain calibration system of claim 26 in which the processor in the first phase averages the analog to digital converter outputs produced in response to amplified voltages, wherein said amplified voltages are produced from amplification of the voltages across the impedances selected from the plurality of impedances.

29. The gain calibration system of claim 24 in which said second switching circuit in the second phase couples the voltage across all of the plurality of impedances collectively to the inputs of the analog to digital converter.

30. The gain calibration system of claim 24 in which said processor responds to the ratio of the analog to digital converter outputs in the first and second phases to calculate the calibration factor.

31. The gain calibration system of claim 30 in which said processor responds to the ratio of the analog to digital converter outputs in the first and second phases to determine a phase factor and to calculate the calibration factor from the ideal gain of said amplifier divided by the product of the phase factor and the number of impedances employed in the first and second phases.

32. The gain calibration system of claim 24 in which said second switching circuit de-couples the outputs of the amplifier to be calibrated from the inputs of the analog to digital converter in the second phase.

33. The gain calibration system of claim 24 in which said amplifier includes a plurality of stages.

34. The gain calibration system of claim 24 in which said second switching circuit couples the outputs of said amplifier to the inputs of said analog to digital. converter when calibration is not being performed.

35. The gain calibration system of claim 24 further including a third switching circuit for coupling the output of said first switching circuit to said inputs of said amplifier when calibration is being performed and coupling system inputs to said inputs of said amplifier when calibration is not being performed.

* * * * *